United States Patent [19]
Bourdon

[11] 4,134,817
[45] Jan. 16, 1978

[54] METHOD OF ATTACKING A THIN FILM BY DECOMPOSITION OF A GAS IN A PLASMA

[75] Inventor: Bernard Bourdon, Orsay, France

[73] Assignee: Alsthom-Atlantique, Paris Cedex, France

[21] Appl. No.: 868,239

[22] Filed: Jan. 10, 1978

[30] Foreign Application Priority Data

Jan. 11, 1977 [FR] France .................................. 77 00586

[51] Int. Cl.$^2$ ................................................ C23C 15/00
[52] U.S. Cl. ................................. 204/192 E; 156/643; 204/298
[58] Field of Search ................................ 156/643, 646; 204/192 E, 298

[56] References Cited

U.S. PATENT DOCUMENTS

| | | | |
|---|---|---|---|
| 3,951,709 | 4/1976 | Jacob | 156/646 |
| 3,971,684 | 7/1976 | Muto | 156/13 |
| 3,984,301 | 10/1976 | Matsuzaki | 204/192 E |
| 3,994,793 | 11/1976 | Harvilchuck | 204/192 E |
| 4,030,967 | 6/1977 | Ingrey | 204/192 E |

OTHER PUBLICATIONS

Orla Christensen, Characteristics and Applications of Bias Sputtering, Solid State Technology, vol. 13, No. 12, Dec. 1970, pp. 39–45.
Christensen and Jensen, RF Biasing through Capacitive Collector to Target Coupling in RF Diode Sputtering, J. Physics, E, vol. 5, No. 1, Jan. 1972 pp. 86–90.

*Primary Examiner*—John H. Mack
*Assistant Examiner*—William Leader
*Attorney, Agent, or Firm*—Sughrue, Rothwell, Mion, Zinn and Macpeak

[57] ABSTRACT

In the manufacture of electronic components, a thin film is attacked by decomposition of a gas in a plasma. The thin film is mounted on a substrate which is RF biased with respect to the plasma thereby attracting fluorine ions for example which carry out the attack. This speeds the rate of attack and improves the definition of attacked portions of the substrate.

10 Claims, 2 Drawing Figures

METHOD OF ATTACKING A THIN FILM BY DECOMPOSITION OF A GAS IN A PLASMA

FIELD OF THE INVENTION

The present invention relates to a method of etching or attacking a thin film by decomposition of a gas in a plasma.

BACKGROUND OF THE INVENTION

Such attacks are required in particular in the manufacture of semi-conductor components which may be constituted, for example, of silicon or of silicon carbide SiC and on which a protective layer has been initially deposited. The layer may be of silica or of silicon nitride for example, and windows need to be cut therethrough.

It may also be necessary to attack a thin film of semiconductor material itself.

Numerous methods of attack are known: aqueous phase chemical attack; ionic attack in a chemically inert gas without chemical decomposition; and gas phase chemical attack at high temperature, above 1000° C. The known ionic attack method is called "cathod sputtering." The material which is to be attacked is introduced in the form of a solid target. A direct electric field is established between the target and a plasma which is created on site from a gas by means of a high frequency field. The field causes the target to be bombarded with ions, thereby tearing atoms away from the target by means of cathode sputtering. This method may also be used to deposit target material onto a substrate placed in the neighborhood of the target.

The quality of the deposit can then be improved by electrically polarizing the substrate with respect to the plasma, for example by means of a connection between the substrate and the target, provided the target constitutes one of the conductive surfaces between which the high frequency field is applied, thereby enabling the direct electric field to be established by the high frequency source. In this case, the substrate is connected via an impedance, for example a variable capacitor as described in an article by Orla Christensen et al. "RF biasing through capacitive collector to target coupling in RF diode sputtering" Journal of Physics E.: Scientific Instruments 1972 vol. 5, printed in Great Britain.

Finally low temperature gas phase methods of chemical attack are known in which a gas such as carbon tetrafluoride $CF_4$ is decomposed in a plasma created by a radio frequency field. The decomposition results from the molecules being broken by the electron collisions produced in the plasma. One of the decomposition products, e.g., fluorine ions, chemically attacks the film to be attacked, e.g., silica. This method of chemical attack by decomposition of a gas in a plasma has the drawback of low geometrical definition of the attacked zones:

The zones which should not be attacked are protected by a layer of resin through which there are windows defining the zones which are to be attacked. Now the zone which is attacked extends beyond the edge of the window and penetrates beneath the layer of resin to a distance which cannot be accurately forecast. This phenomenon is called under-etching.

Another drawback of this known method is that the rate of attack is slow. The rate can be increased a little by increasing the gas pressure, but this results in an increase in the underetching. It may also be increased by increasing the radio frequency power, but that can cause the protective layer of resin to come unstuck, on account of its becoming heated by electron bombardment. In practice, acceptable definition in the order of 0.1 microns can only be retained by accepting a rate of attack which is limited to about 20 to 30 angstroms per minute.

Hewlett-Packard's French Pat. No. 2,253,280 which corresponds partially to U.S. Pat. No. 3,971,684 describes a method of attack by decomposition of a gas in a plasma. It aims to obtain both a high rate of attack and precise definition in the attacked zones. To do this it biases the substrate negatively with respect to the plasma. This bias stems from the fact that one of the terminals of the HF generator is connected to the substrate. Nonetheless this method does not completely eliminate the above mentioned drawback relating to the rate of attack. Also it is difficult in their method to chose an appropriate negative potential for the substrate since it stems from the application of the HF voltage which has to be chosen to be appropriate for the formation of the plasma.

The aim of the present invention is to provide a method of attacking a thin film by decomposition of a gas in a plasma, which enables both a high rate of attack and a precise geometric delimitation of the attacked zones to be obtained.

SUMMARY OF THE INVENTION

The present invention provides a method of attacking a thin film by decomposition of a gas in a plasma. The method comprises the introduction into a chamber of a substrate bearing a film to be attacked.

Further, the method involves the introduction into the said chamber of a gaseous medium at a pressure lying between $10^{-2}$ and $10^{-4}$ torr, the medium containing molecules capable of being broken by electron bombardment to give rise to positive ions and negative ions, the positive ions being capable of chemically attacking the material of the said film.

The application of a high frequency difference of electric potential between an electrically grounded conductive surface and a target conductive surface is effected with these conductive surfaces being situated on either side of said substrate in such a manner as to create a plasma in the said chamber in the neighborhood of the substrate.

The substrate is electrically connected at high frequencies to the surface of the target via a biasing impedance, and the said gaseous medium is introduced into the said chamber via a tube in which the pressure is maintained between 0.2 and 4 torr, the tube being pierced by injection ports which face the substrate so that the gaseous medium is introduced in the form of jets which are directed towards the substrate.

Preferably there is a large pressure gradient between the injection ports and the substrate. The pressure upstream of the ports is preferably between 0.5 and 1 torr while the pressure in the vicinity of the substrate is about $10^{-3}$ torr. Under these conditions, when an RF bias is applied to the substrate, the substrate becomes negatively biased because of the difference of mobility between the ions and the electrons in the plasma. This bias creates an accelerating field for positive ions (e.g., $F^+$). The lower the pressure in the vicinity of the substrate, the more effective is the field since the free path of the positive ions is greater. The presence of such a field increases the rate of attack by the positive ions.

A way of implementing the invention will be described by way of example with reference to the accompanying drawings.

DESCRIPTION OF THE PREFERRED EMBODIMENT

Figure 1:
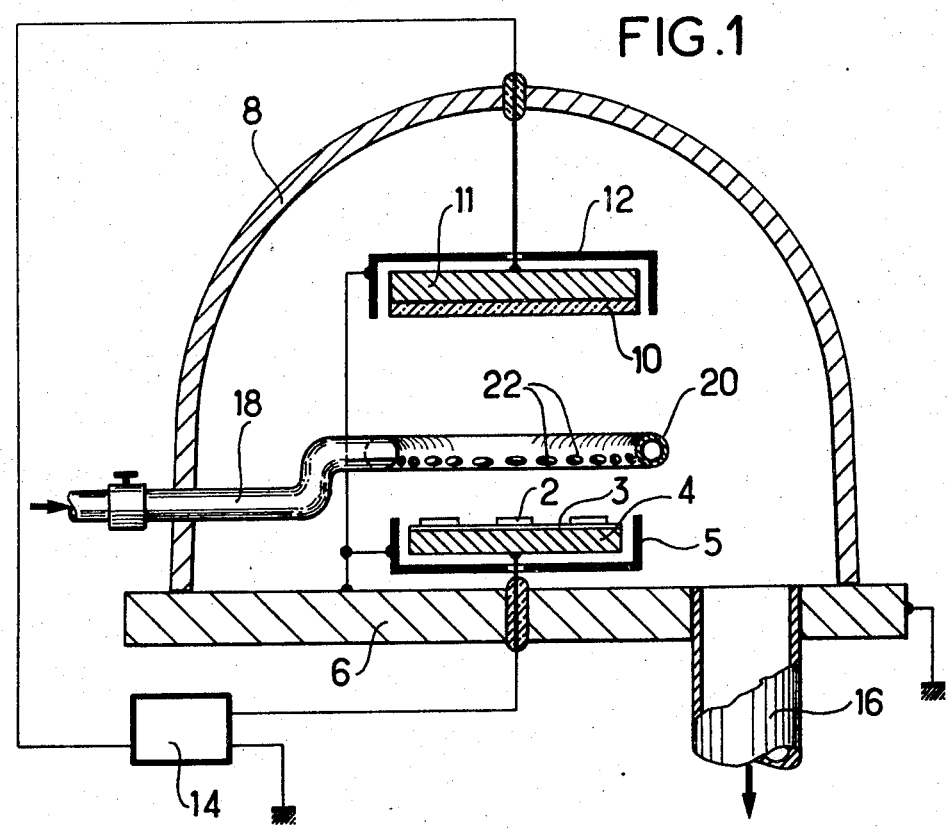
FIG. 1 is a vertical sectional view of a cathode sputtering chamber used for performing the invention.

Substrates 2 are constituted of silicon oxide, i.e., are covered with a 0.3 micron thick film of silica for example. To gain access to the silicon, windows must be cut through the film. For this purpose the film has previously been covered with a layer of conventional photosensitive resin, for example of the type known as KTFR sold by the American Kodak company, having a thickness of about 0.5 to 1 micron. This layer of resin is irradiated by ultra-violet light through a photo-engraved mask, so as to polymerize it, except for the zones which are hidden by the photo-engraving mask. The non-polymerized resin is then dissolved in a developer bath and the substrate heated for 1 hour at 135° C to cure the resin.

The substrates 2 are placed on a thin disk 3 which is itself place on a copper substrate support 4 located without electrical contact in a metal cup 5 which forms a guard ring. The disk 3 is 2 mm thick and does not prevent high frequency electrical connection between the substrate support 4 and the substrates 2. The sole function of the disk is to avoid chemical pollution of the substrates 2 by the support 4. The metal cup 5 is placed on a horizontal stainless steel plate 6 which forms a conductive surface connected to earth and constitutes the base of a cathode sputtering chamber. This chamber also comprises a bell-shaped stainless steel cover 8 which is sealed to the plate 6. Inside the bell 8 and above the substrate 2 is a target 11 in the form of a horizontal stainless steel disk which is 15 cm in diameter and 5 mm thick. On the conductive surface of the target 11 there is a plate of quartz 10 having a thickness of 4 mm. This target assembly is surrounded on all sides except that facing the substrates 2 by a metal guard ring 12 which is electrically connected to the plate 6. The metal disk 11 is insulated from the guard ring 12 and is connected to a first terminal of a high-frequency generator 14, which has a second terminal earthed, which may be accomplished by connecting it to the plate 6. The generator 14 operates at a frequency of 13.56 MHz, and has a power output of 1 kW.

The base 6 has a large diameter opening connected to a pipe 16 which is also of large diameter (even though this diameter is shown small in the drawing to facilitate the understanding thereof) and the pipe 16 is connected to an oil vapour diffusion pump which is itself connected to a vane pump whose outlet orifice is in communication with the atmosphere.

The substrates 2 are electrically connected via the substrate support 4 to a third output terminal of the generator 14 which supplies a high-frequency alternating voltage whose amplitude, measured relative to earth potential, is less than the voltage applied to the metal disk 11.

Figure 2:
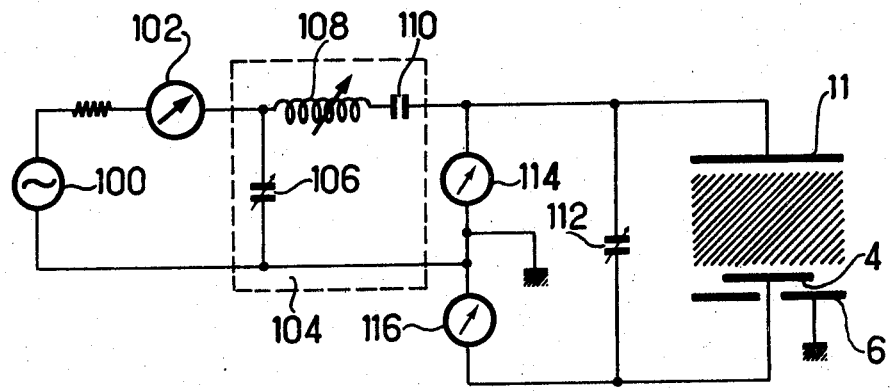
FIG. 2 is a circuit diagram of the high frequency supply system which is utilized with the chamber of FIG. 1.

Referring to FIG. 2, the generator 14 comprises a high-frequency source 100, the power output of which is measured by a wattmeter 102. The generator output is passed through a tuned circuit 104 comprising a variable shunt capacitor 106 and a variable inductor 108 in series with a fixed capacitor 110. This tuned circuit feeds the first and second output terminals of the generator, respectively connected to the metal disk 11 and to earth. A variable capacitor 112 connects the metal disk 11 to the substrate 2 and enables the biasing of the substrate relative to the plasma between the metal disk 11 and the substrate to be adjusted. The direct current voltages on the metal disk 11 and the substrate support 4 are measured by respective voltmeters 114 and 116. The negative potential relative to earth at the substrates 2 is set to a value in a range of 15 to 500 volts, a preferred range being 100 to 300 volts with a value of 150 volts for example. The potential of the substrates 2 is the same as that of the substrate support 4 since it is derived from the application of the same HF voltage with respect to the plasma.

Referring again to FIG. 1, after the substrates 2 are placed in the chamber, a mixture of gases is introduced via a tube 18 which forms a ring running around the space defined between the substrates 2 and the target assembly. This ring is located about 2 cm from the target assembly, at the interface between the exposed and obscured regions.

The pressure in the ring is maintained between 0.2 and 4 torr and preferably between 0.5 and 2 torr. The gaseous mixture escapes through 12 injection ports 22 which have a diameter of 0.5 to 1 mm, e.g., 0.8 mm, and which are directed towards the substrates 2 so as to form inlet jets at an angle of about 45° to the vertical. The number of inlet ports may be between 8 and 20.

The flow rate of the gaseous mixture is set to produce a pressure in the enclosure of $10^{-2}$ to $10^{-4}$ torr, for example, $10^{-3}$ torr. The gaseous medium contains between 1% and 100% carbon tetrafluoride $CF_4$ by volume and possibly hydrogen or helium. For example it may contain 30% hydrogen by volume. Once the pressure has stabilized inside the chamber 8, the generator 14 is turned on. In spite of the low temperature, the film of silica $SiO_2$ is then attacked by virtue of the presence of the radio frequency field. At the end of the 30 minutes necessary for attacking this film, the generator 14 is stopped. The introduction of the gaseous mixture via the tube 18 is also stopped and the chamber continues to be evacuated via the tube 16 until its pressure has fallen to about $10^{-6}$ torr.

The present invention has the following advantages:
1 — the substrate remains at a very moderate temperature;
2 — the rate of attack is high, for example 100 angstroms per minute; and
3 — the periphery of the attack zone follows practically exactly the periphery of the windows made in the layer of photo sensitive resin.

These last two advantages are connected with the electric field present in the neighborhood of the attacked film which results from the presence of the capacitor 112. This electric field has two effects: firstly it repells the negative carbon ions and secondly it attracts the positive fluorine ions.

Naturally the gaseous medium is chosen according to the nature of the thin film to be attacked, and according to that of the substrate on which the film is deposited, so as to avoid the substrate being strongly attacked. For films deposited on a silicon substrate carbon tetrafluoride $CF_4$ and sulpha hexafluoride $SF_6$ are appropriate.

Only the latter gas can be chosen to attack a film of titanium or to attack a thin superficial film of the silicon substrate itself.

When using carbon tetrafluoride $CF_4$ it can be observed that the electric field in the vicinity of the substrates repels carbon ions and avoids any carbon or carbon compounds being deposited on the substrates.

It can also be observed that using jets directed towards the substrates in accordance with the invention, enables two apparently incompatible results to be achieved simultaneously. The first of the results is that the pressure in the vicinity of the substrates remains low enough for the attacking ions to be subject to very few collisions, and the second is that new attacking gas is brought to the vicinity of the substrates at a high mass flow rate.

What is claimed is:

1. A method of etching a thin film by decomposition of a gas in a plasma, said method comprising the following steps:
    placing a substrate bearing a film to be etched into a chamber;
    introducing a gaseous medium at a pressure lying between $10^{-2}$ and $10^{-4}$ torr into said chamber, said medium containing molecules capable of being broken by electron bombardment to give rise to positive ions and negative ions, the positive ions being capable of chemically attacking the material of said film;
    applying a high frequency difference of electric potential between an electrically grounded conductive surface and a target conductive surface with said conductive surfaces being situated on either side of said substrate in such a manner as to create a plasma in said chamber in the neighborhood of the substrate;
    electrically erasing said substrate relative to said plasma by connecting said substrate to said target through a biasing impedance, and
    introducing said gaseous medium into said chamber via a tube in which the pressure is maintained between 0.2 and 4 torr with the tube being pierced by injection ports which face the substrate to cause the gaseous medium in the form of jets to be directed towards the substrate.

2. A method according to claim 1, wherein said biasing impedance is a capacitor.

3. A method according to claim 2, wherein said film contains silicon or titanium and said step of introducing a gaseous medium comprises introducing a gaseous fluoride so that the breaking of the molecules causes positive fluorine ions to appear.

4. A method according to claim 3, wherein said step of introducing a gaseous medium also introduces a gas chosen from the group consisting of hydrogen and helium.

5. A method according to claim 3, wherein said step of introducing a gaseous medium includes introducing gaseous fluoride chosen from the group consisting of carbon tetrafluoride $CF_4$ and sulphur hexafluoride $SF_6$.

6. A method according to claim 1, wherein the two conductive surfaces are plane, parallel and face each other inside said chamber and the step of disposing said substrate comprises disposing said substrate in the gap between these two surfaces at a distance from the edges of each of them.

7. A method according to claim 1, further comprising the following steps, prior to the introduction of the substrate into the chamber:
    covering said thin film with a layer of photosensitive resin;
    irradiating said layer of resin through a photoengraving mask which delimits zones which are irradiated and zones which are not irradiated; and
    treating said layer of resin to eliminate given zones, so that said thin film is subsequently attacked in the zones where the layer of resin has been eliminated and is protected in the zones where the layer of resin has been conserved.

8. A method according to claim 7, characterized by the fact that the said biasing impedance is chosen in such a way that the negative potential of the substrate with respect to the chamber lies between 15 and 500 volts.

9. A method according to claim 8, wherein the said biasing impedance is chosen in such a manner that the negative potential of the substrate with respect to the chamber lies between 100 and 300 volts.

10. A method according to claim 6, wherein the said tube via which the gaseous medium is introduced into the chamber is in the form of an injection ring surrounding the space between the target surface and the substrate and the injection ports are pierced in the inner wall of the ring.

* * * * *

UNITED STATES PATENT AND TRADEMARK OFFICE
CERTIFICATE OF CORRECTION

PATENT NO. : 4,134,817
DATED : January 16, 1979
INVENTOR(S) : Bernard Bourdon

It is certified that error appears in the above-indentified patent and that said Letters Patent is hereby corrected as shown below:

On the cover page under item [45], after "Jan. 16," please delete "1978" and substitute therefor --1979--.

In column 5, claim 1, line 38, change "erasing" to --biasing--.

Signed and Sealed this

Twenty-first Day of November, 1995

Attest:

BRUCE LEHMAN

Attesting Officer     Commissioner of Patents and Trademarks